United States Patent
Cornog et al.

(10) Patent No.: US 6,337,880 B1
(45) Date of Patent: Jan. 8, 2002

(54) INDEXING FOR MOTION VIDEO THAT IS COMPRESSED USING INTERFRAME AND INTRAFRAME TECHNIQUES

(75) Inventors: Katherine H. Cornog, Newburyport, MA (US); James Hamilton, Redwood City, CA (US); Oliver Morgan, Lexington, MA (US)

(73) Assignee: Avid Technology, Inc., Tewksbury, MA (US)

( * ) Notice: Subject to any disclaimer, the term of this patent is extended or adjusted under 35 U.S.C. 154(b) by 0 days.

(21) Appl. No.: 09/544,869

(22) Filed: Apr. 7, 2000

Related U.S. Application Data

(63) Continuation of application No. 08/832,987, filed on Apr. 4, 1997.

(51) Int. Cl.[7] .............................. H04B 1/66; H04N 7/12
(52) U.S. Cl. ...................... 375/240.01; 386/4; 386/111
(58) Field of Search ...................... 375/240.01, 240.13, 375/240.16, 240.12; 348/7, 12, 13, 385.1, 407.1, 412.1, 415.1, 699, 700; 386/4, 5, 52, 109–112; 382/305; H04N 7/10, 7/12; H04B 1/66

(56) References Cited

U.S. PATENT DOCUMENTS

| | | | | |
|---|---|---|---|---|
| 5,315,326 A | * | 5/1994 | Sugiyama | 375/240.12 |
| 5,414,455 A | * | 5/1995 | Hooper et al. | 348/7 |
| 5,442,390 A | * | 8/1995 | Hooper et al. | 348/7 |
| 5,459,517 A | * | 10/1995 | Kunitake et al. | 375/240.13 |
| 5,642,174 A | * | 6/1997 | Kazui et al. | 348/700 |
| 5,768,447 A | * | 6/1998 | Irani et al. | 382/305 |
| 5,959,690 A | * | 9/1999 | Toebes, VIII et al. | 375/240.16 |
| 6,167,083 A | | 12/2000 | Sporer et al. | |

* cited by examiner

*Primary Examiner*—Chris Kelly
*Assistant Examiner*—Gims Philippe
(74) *Attorney, Agent, or Firm*—Peter J. Gordon

(57) ABSTRACT

Random access to arbitrary images, whether frames or fields, of a video segment compressed using both interframe and intraframe techniques may be enhanced by including state information, for decoding and display, at appropriate points in the compressed bitstream to enable random access to each intraframe compressed image. The state information may be inserted during compression or by processing the bitstream of compressed data. An image index also may be generated that maps each temporal image in a decompressed output image sequence to an offset in the compressed bitstream of the data used to decode the image. The index may be created during compression or by processing the bitstream of compressed data. To access one or more samples starting with a specified point in time in a decompressed output image sequence, the index is accessed using the specified point in time to identify another sample in the decompressed output image sequence for which data is used to produce the specified sample. The identity of the other sample is used to access the index to identify a location in the compressed data for the data used to produce the specified sample.

36 Claims, 5 Drawing Sheets

| TEMPORAL FIELD NUMBER | TEMPORAL ORDER OFFSET | RANDOM ACCESS OFFSET | SEQUENCE HEADER BIT | RANDOM ACCESS BI | PICTURE TYPE | DISK OFFSET |
|---|---|---|---|---|---|---|
| 0 | 0 | 0 | 1 | 1 | I | 0x0010000 |
| 1 | 0 | -1 | 0 | 0 | I | 0x0010000 |
| 2 | 3 | -2 | 0 | 0 | P | 0x0020000 |
| 3 | 3 | -3 | 0 | 0 | P | 0x0020000 |
| 4 | 3 | -4 | 0 | 0 | P | 0x0020000 |
| 5 | 3 | -5 | 0 | 0 | B | 0x0030000 |
| 6 | 3 | -6 | 0 | 0 | B | 0x0030000 |
| 7 | -5 | -7 | 0 | 0 | B | 0x0030000 |
| 8 | -5 | -8 | 0 | 0 | B | 0x0040000 |
| 9 | -5 | -9 | 0 | 0 | B | 0x0040000 |
| 10 | 2 | -10 | 0 | 0 | P | 0x0050000 |
| 11 | 2 | -11 | 0 | 0 | P | 0x0050000 |
| 12 | -2 | -12 | 0 | 0 | B | 0x0060000 |
| 13 | -2 | -13 | 0 | 0 | B | 0x0070000 |
| 14 | 0 | 0 | 1 | 1 | I | 0x0080000 |
| 15 | 0 | -1 | 0 | 0 | I | 0x0080000 |
| 16 | 3 | -2 | 0 | 0 | P | 0x0090000 |
| 17 | 3 | -3 | 0 | 0 | P | 0x0090000 |
| 18 | 3 | -4 | 0 | 0 | P | 0x0090000 |
| 19 | 3 | -5 | 0 | 0 | B | 0x0100000 |
| 20 | 3 | -6 | 0 | 0 | B | 0x0100000 |
| 21 | -5 | -7 | 0 | 0 | B | 0x0100000 |
| 22 | -5 | -8 | 0 | 0 | B | 0x0110000 |
| 23 | -5 | -9 | 0 | 0 | B | 0x0110000 |
| 24 | 2 | -10 | 0 | 0 | P | 0x0120000 |
| 25 | 2 | -11 | 0 | 0 | P | 0x0120000 |
| 26 | -2 | -12 | 0 | 0 | B | 0x0130000 |
| 27 | -2 | -13 | 0 | 0 | B | 0x0140000 |

FIG. 2B

| 90-BITSTREAM ORDER OF MPEG PICTURES: | | | | | | | | | | | | | |
|---|---|---|---|---|---|---|---|---|---|---|---|---|---|
| I0 | P3 | B1 | B2 | P6 | B4 | B5 | | | | | | | |
| 92- NUMBER OF VIDEO FIELDS REPRESENTED BY EACH CODED PICTURE: | | | | | | | | | | | | | |
| 2 | 3 | 3 | 2 | 2 | 1 | 1 | | | | | | | |
| 94-TEMPORAL FIELD #: | | | | | | | | | | | | | |
| 0 | 1 | 2 | 3 | 4 | 5 | 6 | 7 | 8 | 9 | 10 | 11 | 12 | 13 |
| — | — | — | — | — | — | — | — | — | — | — | — | — | — |
| 96-MPEG PICTURES: | | | | | | | | | | | | | |
| I0 | I0 | B1 | B1 | B2 | B2 | P3 | P3 | P3 | P3 | B4 | B5 | P6 | P6 |
| 97-FIELD INDEX: ENTRY NUMBER: | | | | | | | | | | | | | |
| 0 | 1 | 2 | 3 | 4 | 5 | 6 | 7 | 8 | 9 | 10 | 11 | 12 | 13 |
| 98-FIELD INDEX:OFFSET: | | | | | | | | | | | | | |
| I0 | I0 | P3 | P3 | P3 | B1 | B1 | B1 | B2 | B2 | P6 | P6 | B4 | B5 |
| 99-TEMPORAL OFFSET: | | | | | | | | | | | | | |
| 0 | 0 | 3 | 3 | 3 | -5 | -5 | -5 | -5 | -5 | 2 | 2 | -2 | -2 |

FIG. 3

INDEXING FOR MOTION VIDEO THAT IS COMPRESSED USING INTERFRAME AND INTRAFRAME TECHNIQUES

CROSS-REFERENCE TO RELATED APPLICATIONS

This application is a continuing application of U.S. patent application Ser. No. 08/832,987, filed Apr. 4, 1997, which is hereby incorporated by reference.

BACKGROUND

Several systems are presently available for capture, editing and playback of motion video and associated audio. A particular category of such systems includes digital nonlinear video editors. Such systems store motion video data as digital data, representing a sequence of digital still images, in computer data files on a random access computer readable medium. A still image may represent a single image, a single frame, i.e., two fields, or a single field of motion video data. An image may be progressive or interlaced. Such systems generally allow any particular image in the sequence of still images to be randomly accessed for editing and for playback. Digital nonlinear video editing systems have several benefits over previous video tape-based systems which provide only linear access to video information.

Because digital data representing motion video may consume large amounts of computer memory, particularly for full motion broadcast quality video (e.g., sixty field per second for NTSC and fifty fields per second for PAL), the digital data typically is compressed to reduce storage requirements. There are several kinds of compression for motion video information. One kind of compression is called "intraframe" compression which involves compressing the data representing each still image independently of other still images. Commonly-used intraframe compression techniques employ a transformation to the frequency domain from the spatial domain, for example, by using discrete cosine transforms. The resulting values typically are quantized and encoded. Commonly-used motion video compression schemes using intraframe compression include "motion-JPEG" and "I-frame only" MPEG. Although intraframe compression reduces redundancy of data within a particular image, it does not reduce the significant redundancy of data between adjacent images in a motion video sequence. For intraframe compressed image sequences, however, each image in the sequence can be accessed individually and decompressed without reference to the other images. Intraframe compression allows purely nonlinear access to any image in the sequence.

Motion video sequences can be compressed more by using what is commonly called "interframe" compression which reduces information redundancy between images. Interframe compression, for example, may involve storing information for predicting one image using another. This kind of compression often is used in combination with intraframe compression. For example, a first image may be compressed using intraframe compression, and typically is called a key frame. The subsequent images may be compressed by generating predictive information that, when combined with other image data, results in the desired image. Intraframe compressed images may occur occasionally so often throughout a sequence of compressed images. Several standards use interframe compression techniques, such as MPEG-1(ISO/IEC 11172-1 through 5), MPEG-2 (ISO/IEC 13818- 1 through 9) and H.261, an International Telecommunications Union (ITU) standard. MPEG-2, for example, compresses some images using intraframe compression (called I-frames or key frames), and other images using interframe compression techniques for example by computing predictive errors between images. The predictive errors may be computed for forward prediction (called P-frames) or bidirectional prediction (called B-frames). Other examples of interframe compression formats include Compact Video (also known as Cinepak), CD-I and DVI.

For interframe compressed image sequences, the interframe compressed images in the sequence can be accessed and decompressed only with reference to other images in the sequence. Accordingly, interframe compression does not allow purely nonlinear access to every image in the sequence, because an image may depend on either previous or following images in the sequence. Generally speaking, only the intraframe images in the sequence may be accessed nonlinearly. However, in some compression formats, such as MPEG-2, some state information used for decoding or displaying an intraframe compressed image, such as a quantization table, also may occur elsewhere in the compressed bitstream, eliminating the ability to access even intraframe compressed images nonlinearly.

Another problem arises with the use of some standards, such as MPEG-2, in which there are many options that may or may not be present in a coded bitstream. For example, an MPEG-2 formatted bitstream may include only I-frames, or I and P frames, or I, B and P frames. The order in which these frames is displayed also may be different from the order they are stored. Each compressed image also may be used to produce anywhere from zero to six fields. State information used to decode any particular image, including an I-frame, may also occur at any point in the bitstream. As a result, the ability to randomly access a particular field in an arbitrary MPEG-2 compliant bitstream may be determined by the actual format of the bitstream.

SUMMARY

Random access to arbitrary images, whether frames or fields, of a video segment compressed using both interframe and intraframe techniques may be enhanced by including state information, for decoding and display, at appropriate points in the compressed bitstream to enable random access to each intraframe compressed image. The state information may be inserted during compression or by processing the bitstream of compressed data.

An image index also may be generated that maps each temporal image in a decompressed output image sequence to an offset in the compressed bitstream of the data used to decode the image. The index may be created during compression or by processing the bitstream of compressed data.

To access one or more samples starting with a specified point in time in a decompressed output image sequence, the index is accessed using the specified point in time to identify another sample in the decompressed output image sequence for which data is used to produce the specified sample. The identity of the other sample is used to access the index to identify a location in the compressed data for the data used to produce the specified sample.

BRIEF DESCRIPTION OF THE DRAWINGS

In the drawings,

FIGS. 2A and 2B illustrate example image indices;

FIG. 3 illustrates a relationship of the bitstream order of compressed data to temporal fields and the field index.

DETAILED DESCRIPTION

To allow for random access to each sample, and in particular each intraframe compressed image in a compressed bitstream, any state information or other information which is used to decode and/or display the compressed data is inserted into appropriate points within the bitstream. This information may be so inserted during compression or by reformatting a compressed bitstream. A sample index also may be generated which maps each temporal sample in the decompressed data stream to an offset in the compressed bitstream for the data used to decode the sample.

Figure 1:
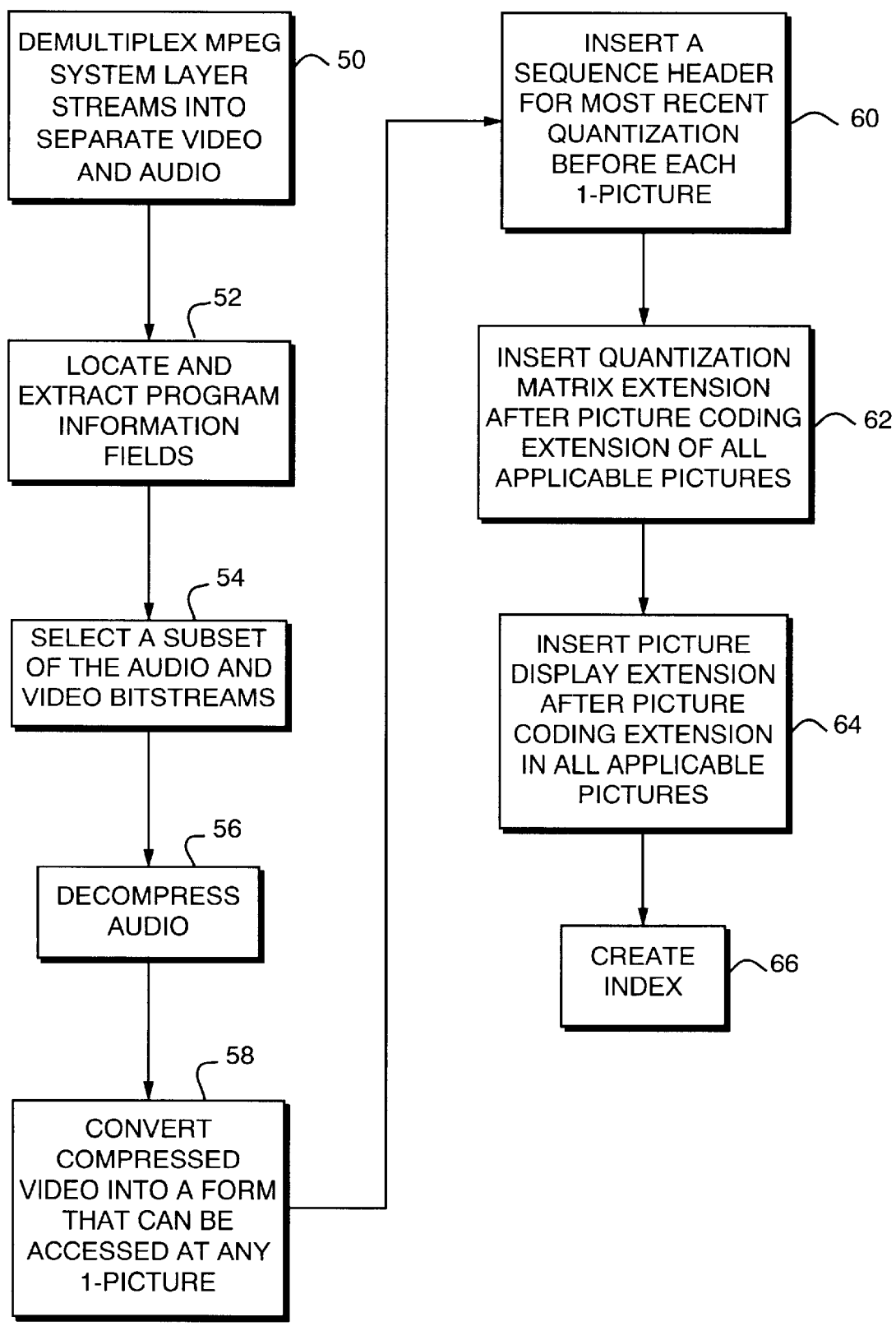
FIG. 1 is a flowchart describing how an MPEG-2 bitstream may be reformatted.

The process of reformatting a compressed bitstream will now be described in connection with FIG. 1. The following description uses MPEG-2 as an example compression format that provides both intraframe and interframe compression of image data. The invention is applicable to other kinds of compression using interframe and intraframe techniques and this description of the invention is provided by way of example only. The invention also is applicable to many kinds of data in which the order of compressed data for samples is different from the order of samples in the decompressed bitstream.

The process of reformatting a compressed MPEG-2 bitstream to enable random access to any intraframe compressed image may be performed while compressing the video data or by processing previously compressed data. The bitstream is reformatted because many values for parameters in an MPEG-2 bitstream can be specified once in the bitstream and then are used for all subsequent images. These parameters are specified in headers and may specify values such as a sequence header, sequence extension, sequence display extension, sequence scalable extension, quantization matrix extension and picture display extension. The various headers are described in more detail in the MPEG-2 specification. The parameters of concern are not headers that provide mere information, such as a copyright header or a "GOP" header, but those parameters that affect decoding and display. If any headers occur after the first picture in the compressed bitstream, and if any headers change any of the state that applies to the decoding and display of subsequent images, then the bitstream is reformatted to insert the headers before each subsequent intraframe-only compressed image (e.g., an I-frame) following the first such change.

The first step 50 of reformatting is demultiplexing MPEG-2 system layer streams into separate audio and video Packetized Elementary Streams (PES) or Elementary Streams (ES). Next, in step 52, program information fields may be located and extracted from the bitstream. Examples of these fields include a program map table in a transport stream or a program stream map in a program stream. The program information defines the association of audio and video bitstreams as programs. A subset of the audio and video bitstreams then is selected in step 54 for import from a system stream.

Audio may be decompressed in step 56 (either MPEG audio or AC-3 audio) and stored as PCM (AIFC) data, for example in a separate data file. It should be noted that audio commonly is edited in an uncompressed format. However, compressed audio data also may be stored and edited. Editing of such compressed audio data in a random access manner also may involve techniques similar to those used for editing compressed video if dependencies between samples or sets of samples are created by compression.

The compressed video is then converted in step 58 into a form that can be accessed at any intraframe-only compressed image, e.g., I-frame, by inserting appropriate header information. The import process begins with this step 58 if the compressed data file contains only video data. In particular, as discussed above MPEG-2 bitstreams are linear media that include state information that may be specified at one or more points in the bitstream, and that applies to all data that follows until a reset condition occurs in the bitstream. Consequently, to enable decoding a bitstream from any arbitrary and randomly accessed intraframe-only compressed image, this state information is identified and repeated before subsequent intraframe-only compressed images. Thus, after reading data from the bitstream from an arbitrary and randomly accessed intraframe only compressed image, the decoder is set to the state it would have been in if it had decoded the bitstream linearly from its beginning. Specific examples are given in the next three steps, for state information called Main Profile, Simple Profile and 4:2:2 Profile. For SNR Profile, Scaleable Profile and High Profile and other state information, additional headers would have to be inserted in a similar manner.

In particular, if any quantization tables are present in any sequence header after the first sequence header, then a sequence header with the most recently occurring set of quantization tables is inserted just prior to each coded I-intraframe-only compressed image for the rest of the bitstream, in step 60. For MPEG-2, a sequence extension also is inserted each time a sequence header is inserted. Also for MPEG-2, if a sequence display extension occurs following the first sequence header, then a sequence display extension is inserted after the sequence extension each time a sequence header and sequence extension is inserted.

Similarly, if a quantization matrix extension occurs following the picture coding extension of any coded picture then a quantization matrix extension is inserted, in step 62, following the picture coding extension of all subsequent pictures to which the matrices in the quantization matrix extension apply until either another quantization matrix extension occurs or the next sequence header occurs.

Next, in step 64, if a picture display extension occurs following any picture coding extension, then a picture display extension with the most recently decoded frame center offset is inserted following all subsequent picture coding extensions until either another picture display extension occurs or the next sequence header occurs.

Reformatting the compressed bitstream can be avoided by digitizing and compressing the motion video so that the state information already exists in the bitstream in a manner that allows random access to and playback from any intraframe compressed image. In particular, the encoder should implement the following constraints. First, to properly insert sequence headers, the encoder is set up to encode the bitstream such that one of the following three a conditions is true: 1) there is a sequence header at the beginning of the bitstream and no other sequence header in the bitstream, or 2) there is a sequence header prior to every intraframe-only compressed image, or 3) there is a sequence header at the beginning of the bitstream and prior to every intraframe-only compressed image following the first repeat sequence header containing quantization tables which differ from the ones in the first sequence header, if there were any specified in the first sequence header, or from the default quantization tables, if no tables were specified in the first sequence header.

To properly handle quantization matrix extensions (Quant Matrix Extension or QME), the encoder is set up to encode the bitstream such that: 1) if a QME appears within an intraframe-only compressed image, then a QME must appear within every intraframe-only compressed image until the next sequence header is inserted, and 2) if a Quant Matrix Extension (QME) appears within an intraframe-only compressed image, then a QME must appear within every intraframe-only compressed image until the next sequence header is inserted.

To properly handle picture display extensions (PDE), the encoder is set up to encode the bitstream such that if a PDE appears within any compressed image, then a PDE must appear within every compressed image until the next sequence header is inserted.

If the MPEG stream is reformatted to allow random access, or a stream is captured in a format that allows random access, an index may be created (66). The index may be used to find the compressed video data which corresponds to a particular image in the video sequence and to determine what compressed video data should be fed to the MPEG decoder to display the particular image.

A format of an example index will now be described in connection with FIG. 2A. For each MPEG file, either the import process or the digitize process creates an index 70 with one entry 72 for each image, such as a field. The entries 72 in the index are stored in the order in which the compressed images occur in the bitstream, i.e., the coded order and not the display order.

In this example, each entry 72 is 64 bits long and includes an offset 74, which may be represented by 48 bits, e.g., bits 0:47. These bits are the byte offset into the bitstream (not a file, such as a file in the Open Media Framework Interchange format) of an MPEG header which precedes the compressed image which represents this image. If the picture is preceded by a sequence header with no intervening images, the index is the byte offset to the sequence header. Otherwise, if the image is preceded by a group of pictures header with no intervening images, the index is the byte offset to the group of pictures header. Otherwise, the index is the byte offset of the header which precedes the image.

Each entry 72 also includes an indication of the picture type 76, which may be represented by two bits, e.g., bits 48–49. Example values are: 01=I-frame, 10=P-frame, 11=B-frame. The value 00 is reserved. This value defines the picture type of the compressed MPEG picture found at the indicated offset 74 in the bitstream.

A random access bit 78 also is stored. This data 78 may be a single bit (e.g., bit 50) that indicates whether random access into the bitstream at the offset 74 given by this entry 72 is possible. A sequence header bit also may be stored to indicate whether this entry 72 references a sequence header, and may be represented by a single bit (e.g., bit 51). For example, if this entry 72 points to a picture header or a GOP header, bit 51 is zero. If this entry 72 points to a sequence header, bit 51 is a one.

The last value in entry 72 is a temporal offset 82. This value signifies the offset between the temporal image number of a video image and the entry number in the index 70 which contains the offset value of the compressed MPEG picture that contains that image. To access image N, where N is the temporal number of the image of interest, entry N is read and the value of the temporal offset 82 which it contains is added to N. This sum is used to access the index 70 again to retrieve the entry 72 which contains the offset 74 of the compressed image containing data for recreating the image of interest. Scanning back in the index 70 from this entry 72 enables the random access point in the bitstream to be identified, from which decompression of the bitstream may start. When decoding, any compressed data on which the desired output image is not dependent may be dropped from the bitstream provided to the decoder. Such dropped data typically includes any B-frames between the random access point and the compressed image containing data for the desired image.

Figure 2A:
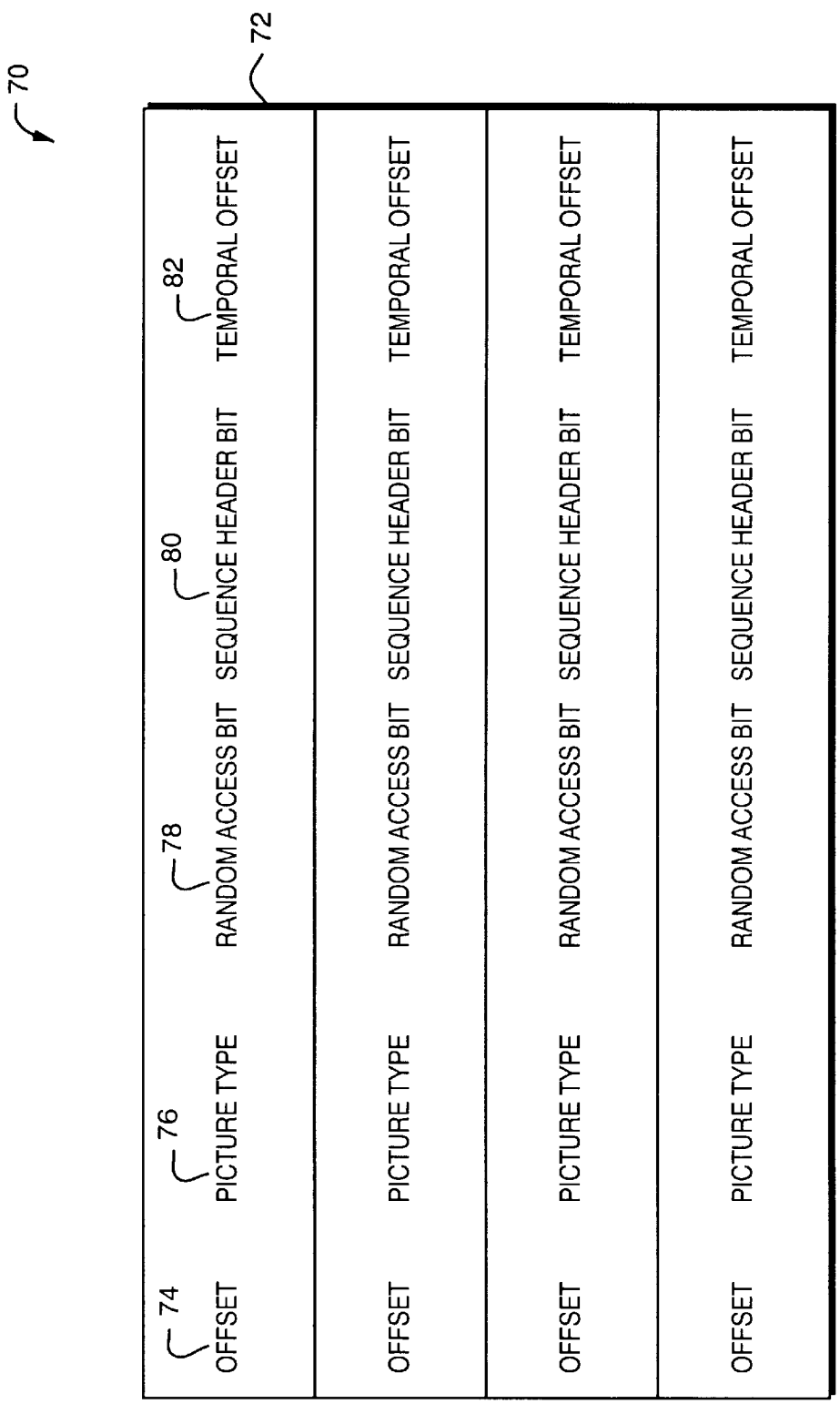

Referring now to FIG. 2B, an index similar to FIG. 2A is described, but which adds another offset value to the index called a "random access offset". The "random access offset" of an image is used to indicate another image that provides the random access point in the bitstream from which decompression of the bitstream may start to produce the image. Use of the random access offset eliminates scanning the index to find this random access point. Each entry 172 in the table 170 includes the disk offset 174, picture type 176, random access bit 178, sequence header bit 180, temporal offset 182, all of which are accessible using the temporal image number, such as the field number, as indicated at 184. The temporal image number shown in column 184 actually is not stored, but is shown for ease of explanation. The random access offset 186 allows for a look up of the random access points corresponding to a given image. The random access offset given a temporal image number it may be subtracted from the temporal image number to provide the temporal image number of the random access point in the MPEG bitstream. More particularly, if N is the temporal image number to be accessed, then the entry number is the sum of N and the temporal offset value stored in entry N of the image index. The offset for the compressed data used for recreating the desired temporal image is provided by the offset value in the entry of the field index having the computed entry number. The random access offset value obtains a random access entry number by adding the random access offset value stored in an entry to the index value N for that entry. The entry in the image index having the computer random access entry number is used to obtain the offset in the bitstream for the image data used to produce the desired output image.

An index such as shown in FIGS. 2A and 2B may be generated as a post-processing task or can be performed while motion video is being compressed. A process for indexing intraframe only sequences is described in U.S. Pat. 5,577,190 (Peters), which is hereby incorporated by reference. In that process, an interrupt is generated at the end of each compressed image output by the encoder. By monitoring a data buffer, an amount of compressed data used for the image is determined. To index sequences of interframe and intraframe compressed images, a similar technique may be used, but additional information should be made available for each image at the time the interrupt is generated. In particular, a type of each compressed image and the number of images represented by each compressed image is used. This information may be known in advance by the settings of the encoder. For example, the encoder may be set to use a regular group of images with inverse telecine (inverse 3:2 pulldown) disabled. Alternatively, the encoder may provide a separate data path, either by an output from the encoder or by registers that may be read, to output for each compressed picture: the compressed image type, the compressed size in bytes and the number of image represented by the compressed image.

An example of an MPEG bitstream and its associated index will now be provided in connection with FIG. 3. This example illustrates a field index which may be generalized and applied to a frame index or other image or sample index. The first section 90, labeled "Bitstream order of MPEG pictures" represents the compressed images found in an MPEG bitstream. The second section 92, labeled "Number of video fields represented by each coded picture," indicates the number of video fields contained in each compressed MPEG picture of the first section. The third section 94 represents the display order of the video fields in the bitstream. Each video field is numbered with a temporal field number, and is represented by a vertical line. The position of the vertical line indicates whether it is a top field or a bottom field. Line 96, labeled "MPEG pictures," indicates which MPEG pictures in the bitstream represent which temporal video fields. The MPEG pictures are now shown in temporal order rather than in bitstream order. Lines 97–99, labeled "Index:Entry Number," "Index:Offset" and "Temporal Offset," respectively, represent the parts the index 70 described above.

Figure 4:
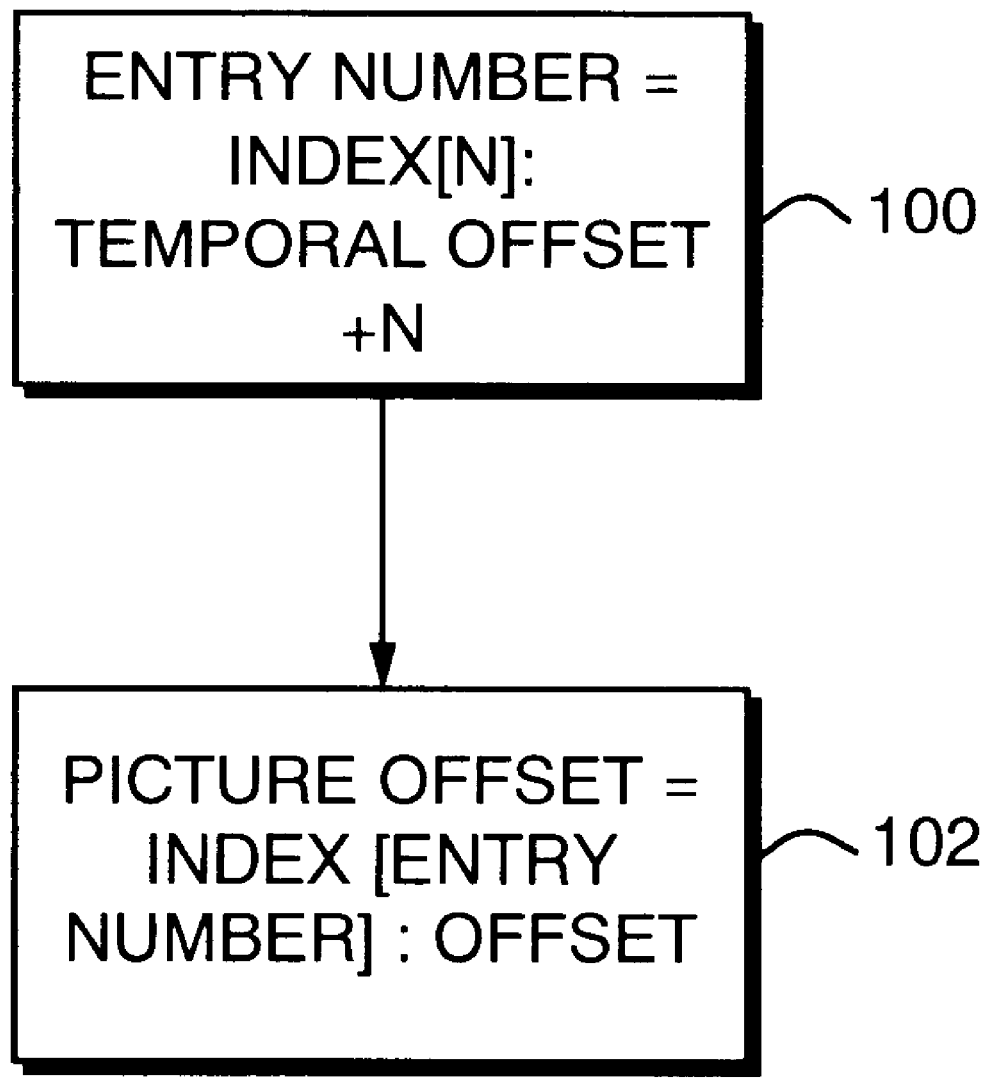
FIG. 4 is a flowchart describing how the image index may be used to identify compressed image data corresponding to a temporal image image.

To locate a compressed image which corresponds to the Nth temporal image, the process shown in FIG. 4 is followed. In particular, an entry number is computed in step 100 by accessing the Nth entry 72 of the index 70 (FIG. 2A) to retrieve the value stored in the temporal offset location 82. The temporal offset value is added to the value N to obtain this entry number. The offset of the desired image is determined in step 102 by accessing the entry corresponding to the computed entry number from step 100 from the index 70. The offset 74 stored in the determined entry is the desired image offset. Using the example shown in FIG. 3, if the temporal image number N is 8, the entry number is 3. The picture offset is the offset value stored in entry number 3 of the index 70, which is the second field of image P3.

Having now provided an example index for MPEG-2 video data, further examples for other compressed data formats will now be described.

In the example index provided above, each entry in the index represents one field of video data. An image may be comprised of two fields, or may be defined by one frame. For progressive source material, it may be more desirable to use a frame based index rather than a field based index. A frame based index also uses half of the storage that a field based index uses, and contains the same information for progressive material.

The index may be accessed by an indication of a temporal sample, such as a point in time in a decompressed output sequence, or other unit of definition of the data. For example, multiple samples of audio may be related to a single entry in the index. The index may be provided for each temporal sample at the temporal resolution at which editing may occur.

The use of the index, i.e., the source of the specification of the temporal sample used to access the index, may be related to various graphical user interface elements used in video editing systems. For example, a bar may appear on a time line indicating a current point in a presentation. During playback, the current point in the presentation may be used to access the index. Other graphical user interface functions such as scrubbing, key frames, or time codes used to specify a frame, may be used to identify a sample to be randomly accessed using the index.

Such an index also may be created as a post process step for a digital versatile disk (DVD) to generate a program archive, to archive data tape, or to enable further operations such as fast forward and fast reverse to view a presentation.

As described above, a compressed bitstream can be reformatted to add state information affecting decoding and display to allow random access to each intraframe compressed image. An index also allows an output sample to be mapped to an offset within the bitstream of the start of compressed data used to reconstruct that sample.

An editing system with which such compressed image data and corresponding index may be used is described in U.S. patent application No. 08/832,987, filed Apr. 4, 1997, which is hereby incorporated by reference.

Having now described a few embodiments, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention.

What is claimed is:

1. A method for creating an index enabling random access to samples of temporal media data in a bitstream of compressed data, wherein the samples of the temporal media data have a temporal sample order different from a bitstream order, the method comprising:

creating an entry in the index for each sample, wherein the entries in the index are ordered in the order of the compressed data for the samples in the bitstream, and wherein each entry has an entry position in the index;

for each entry, storing a byte offset in the bitstream to compressed data for a sample, wherein the entry stores the byte offset for the sample having a position in the bitstream order that corresponds to the entry position of the entry; and for each entry, storing a temporal offset between a position of a sample in the temporal sample order and a position of the sample in the bitstream order, wherein the entry stores the temporal offset for the sample having a position in the temporal sample order that corresponds to the entry position of the entry.

2. The method of claim 1, further comprising:

for each entry, storing a random access offset to another entry that stores the byte offset to the sample from which decompression of the bitstream starts to reconstruct the sample corresponding to the entry.

3. The method of claim 1, further comprising:

for each entry, storing an indication of whether random access for starting decompression of the bitstream is possible using the sample corresponding to the entry.

4. The method of claim 1, further comprising:

for each entry, storing an indication of a type of the sample corresponding to the entry.

5. The method of claim 1, further comprising:

for each entry, storing an indication of a sequence header bit for the sample corresponding to the entry.

6. The method of claim 1, wherein the temporal media data comprises interframe and intraframe compressed video data, the method further comprising:

processing the bitstream to identify state information used for decoding and display; and inserting the state information into the bitstream for each intraframe and each interframe compressed image, thereby allowing random access to any intraframe compressed image.

7. An apparatus for creating an index enabling random access to samples of temporal media data in a bitstream of compressed data, wherein the samples of the temporal media data have a temporal sample order different from a bitstream order, comprising:

means for creating an entry in the index for each sample, wherein the entries in the index are ordered in the order of the compressed data for the samples in the bitstream, and wherein each entry has an entry position in the index;

means for determining and storing, for each entry, a byte offset in the bitstream to compressed data for a sample, wherein the entry stores the byte offset for the sample having a position in the bitstream order that corresponds to the entry position of the entry; and means for determining and storing, for each entry, a temporal offset between a position of a sample in the temporal sample order and a position of the sample in the bitstream order, wherein the entry stores the temporal offset for the sample having a position in the temporal sample order that corresponds to the entry position of the entry.

8. The apparatus of claim 7, further comprising:

means for determining and storing, for each entry, a random access offset to another entry that stores the byte offset to the sample from which decompression of the bitstream starts to reconstruct the sample corresponding to the entry.

9. The apparatus of claim 7, further comprising:

means for determining and storing, for each entry, an indication of whether random access for starting decompression of the bitstream is possible using the sample corresponding to the entry.

10. The apparatus of claim 7, further comprising:

means for determining and storing, for each entry, an indication of a type of the sample corresponding to the entry.

11. The apparatus of claim 7, further comprising:

means for determining and storing, for each entry, an indication of a sequence header bit for the sample corresponding to the entry.

12. The apparatus of claim 7, wherein the temporal media data comprises interframe and intraframe compressed video data, further comprising:

means for processing the bitstream to identify state information used for decoding and display; and means for inserting the state information into the bitstream for each intraframe and each interframe compressed image, thereby allowing random access to any intraframe compressed image.

13. A computer program product, comprising:

a computer readable medium;

computer program instructions stored on the computer readable medium that, when executed by a processor, cause the processor to perform a method for creating an index enabling random access to samples of temporal media data in a bitstream of compressed data, wherein the samples of the temporal media data have a temporal sample order different from a bitstream order, the method comprising:

creating an entry in the index for each sample, wherein the entries in the index are ordered in the order of the compressed data for the samples in the bitstream, and wherein each entry has an entry position in the index;

for each entry, storing a byte offset in the bitstream to compressed data for a sample, wherein the entry stores the byte offset for the sample having a position in the bitstream order that corresponds to the entry position of the entry; and for each entry, storing a temporal offset between a position of a sample in the temporal sample order and a position of the sample in the bitstream order, wherein the entry stores the temporal offset for the sample having a position in the temporal sample order that corresponds to the entry position of the entry.

14. The computer program product of claim 13, wherein the method further comprises:

for each entry, storing a random access offset to another entry that stores the byte offset to the sample from which decompression of the bitstream starts to reconstruct the sample corresponding to the entry.

15. The computer program product of claim 13, wherein the method further comprises:

for each entry, storing an indication of whether random access for starting decompression of the bitstream is possible using the sample corresponding to the entry.

16. The computer program product of claim 13, wherein the method further comprises:

for each entry, storing an indication of a type of the sample corresponding to the entry.

17. The computer program product of claim 13, wherein the method further comprises:

for each entry, storing an indication of a sequence header bit for the sample corresponding to the entry.

18. The computer program product of claim 13, wherein the temporal media data comprises interframe and intraframe compressed video data, wherein the method further comprises:

processing the bitstream to identify state information used for decoding and display; and inserting the state information into the bitstream for each intraframe and each interframe compressed image, thereby allowing random access to any intraframe compressed image.

19. A digital information product, comprising:

a computer readable medium; and data stored on the computer readable medium that, when interpreted by a computer program executing on a computer, comprises an index enabling random access to samples of temporal media data in a bitstream of compressed data, wherein the samples of the temporal media data have a temporal sample order different from a bitstream order, wherein the index comprises:

an entry in the index for each sample, wherein the entries in the index are ordered in the order of the compressed data for the samples in the bitstream, and wherein each entry has an entry position in the index;

in each entry, a byte offset in the bitstream to compressed data for a sample, wherein the entry stores the byte offset for the sample having a position in the bitstream order that corresponds to the entry position of the entry; and in each entry, a temporal offset between a position of a sample in the temporal sample order and a position of the sample in the bitstream order, wherein the entry stores the temporal offset for the sample having a position in the temporal sample order that corresponds to the entry position of the entry.

20. The digital information product of claim 19, further comprising:

in each entry, a random access offset to another entry that stores the byte offset to the sample from which decompression of the bitstream starts to reconstruct the sample corresponding to the entry.

21. The digital information product of claim 19, further comprising:

in each entry, an indication of whether random access for starting decompression of the bitstream is possible using the sample corresponding to the entry.

22. The digital information product of claim 19, further comprising:

in each entry, an indication of a type of the sample corresponding to the entry.

23. The digital information product of claim 19, further comprising:

in each entry, an indication of a sequence header bit for the sample corresponding to the entry.

24. The digital information product of claim 19, wherein the temporal media data comprises interframe and intraframe compressed video data, and wherein the bitstream includes state information used for decoding and display inserted for each intraframe and each interframe compressed image, thereby allowing random access to any intraframe compressed image.

25. A method for using an index to randomly access samples of temporal media data in a bitstream of compressed data, wherein the samples of the temporal media data have a temporal sample order different from a bitstream order, the method comprising:

accessing an index of entries for each sample, wherein the entries in the index are ordered in the order of the compressed data for the samples in the bitstream, and wherein each entry has an entry position in the index, wherein each entry stores a byte offset in the bitstream to compressed data for a sample, wherein the entry stores the byte offset for the sample having a position in the bitstream order that corresponds to the entry position of the entry, and stores a temporal offset between a position of a sample in the temporal sample order and a position of the sample in the bitstream order, wherein the entry stores the temporal offset for the sample having a position in the temporal sample order that corresponds to the entry position of the entry; and using an indication of a position of a sample in the temporal sample order to access an entry in the index having an entry position corresponding to the position of the sample and retrieve the temporal offset for the sample;

adding the temporal offset to the position of the sample in the temporal sample order to obtain a position of the sample in bitstream order; and accessing the entry in the index having an entry position corresponding to the position of the sample in bitstream order to retrieve the byte offset for the sample.

26. The method of claim 25, wherein each entry further stores a random access offset to another entry that stores the byte offset to the sample from which decompression of the bitstream starts to reconstruct the sample corresponding to the entry, and wherein accessing the entry to retrieve the byte offset for the sample further is performed to retrieve the random access offset for the sample.

27. The method of claim 25, further comprising: scanning each entry of the index prior to the entry having an entry position corresponding to the position of the sample in bitstream order to identify an entry for another sample from which random access into the bitstream may commence.

28. The method of claim 25, wherein the indication of a position of a sample in the temporal sample order is received from a graphical user interface that includes a position bar on a time line display related to a composition that uses the temporal media data.

29. An apparatus for using an index to randomly access samples of temporal media data in a bitstream of compressed data, wherein the samples of the temporal media data have a temporal sample order different from a bitstream order, comprising:

means for accessing an index of entries for each sample, wherein the entries in the index are ordered in the order of the compressed data for the samples in the bitstream, and wherein each entry has an entry position in the index, wherein each entry stores a byte offset in the bitstream to compressed data for a sample, wherein the entry stores the byte offset for the sample having a position in the bitstream order that corresponds to the entry position of the entry, and stores a temporal offset between a position of a sample in the temporal sample order and a position of the sample in the bitstream order, wherein the entry stores the temporal offset for the sample having a position in the temporal sample order that corresponds to the entry position of the entry; and means for using an indication of a position of a sample in the temporal sample order to access an entry in the index having an entry position corresponding to the position of the sample and retrieve the temporal offset for the sample;

means for adding the temporal offset to the position of the sample in the temporal sample order to obtain a position of the sample in bitstream order; and means for accessing the entry in the index having an entry position corresponding to the position of the sample in bitstream order to retrieve the byte offset for the sample.

30. The apparatus of claim 29, wherein each entry further stores a random access offset to another entry that stores the byte offset to the sample from which decompression of the bitstream starts to reconstruct the sample corresponding to the entry, and wherein the means for accessing the entry to retrieve the byte offset for the sample further includes means for retrieving the random access offset for the sample.

31. The apparatus of claim 29, further comprising:

means for scanning each entry of the index prior to the entry having an entry position corresponding to the position of the sample in bitstream order to identify an entry for another sample from which random access into the bitstream may commence.

32. The apparatus of claim 29, further comprising means for receiving, from a graphical user interface that includes a position bar on a time line display related to a composition that uses the temporal media data, the indication of a position of a sample in the temporal sample order.

33. A computer program product, comprising:

a computer readable medium; and computer program instructions stored on the computer readable medium that, when executed by a processor cause the processor to perform a method for using an index to randomly access samples of temporal media data in a bitstream of compressed data, wherein the samples of the temporal media data have a temporal sample order different from a bitstream order, the method comprising:

accessing an index of entries for each sample, wherein the entries in the index are ordered in the order of the compressed data for the samples in the bitstream, and wherein each entry has an entry position in the index, wherein each entry stores a byte offset in the bitstream to compressed data for a sample, wherein the entry stores the byte offset for the sample having a position in the bitstream order that corresponds to the entry position of the entry, and stores a temporal offset between a position of a sample in the temporal sample order and a position of the sample in the bitstream order, wherein the entry stores the temporal offset for the sample having a position in the temporal sample order that corresponds to the entry position of the entry; and using an indication of a position of a sample in the temporal sample order to access an entry in the index having an entry position corresponding to the position of the sample and retrieve the temporal offset for the sample;

adding the temporal offset to the position of the sample in the temporal sample order to obtain a position of the sample in bitstream order; and accessing the entry in the index having an entry position corresponding to the position of the sample in bitstream order to retrieve the byte offset for the sample.

34. The computer program product of claim 33, wherein each entry further stores a random access offset to another entry that stores the byte offset to the sample from which decompression of the bitstream starts to reconstruct the sample corresponding to the entry, and wherein accessing the entry to retrieve the byte offset for the sample further is performed to retrieve the random access offset for the sample.

35. The computer program product of claim 33, wherein the method further comprises:

scanning each entry of the index prior to the entry having an entry position corresponding to the position of the sample in bitstream order to identify an entry for another sample from which random access into the bitstream may commence.

36. The computer program product of claim 33, wherein the indication of a position of a sample in the temporal sample order is received from a graphical user interface that includes a position bar on a time line display related to a composition that uses the temporal media data.

* * * * *